United States Patent [19]

Wyatt

[11] Patent Number: 4,958,159
[45] Date of Patent: Sep. 18, 1990

[54] DIGITAL-TO-ANALOG CONVERTER

[75] Inventor: Michael A. Wyatt, Clearwater, Fla.

[73] Assignee: Honeywell Inc., Minneapolis, Minn.

[21] Appl. No.: 432,153

[22] Filed: Nov. 6, 1989

[51] Int. Cl.$^5$ .............................................. H03M 1/66
[52] U.S. Cl. ..................................... 341/144; 341/152
[58] Field of Search ............... 341/144, 146, 145, 152, 341/147

[56] References Cited

U.S. PATENT DOCUMENTS

| 3,435,196 | 3/1969 | Schmid | 341/147 |
| 3,823,396 | 7/1974 | Lode | 341/145 |
| 4,590,457 | 5/1986 | Amir | 341/152 |
| 4,837,572 | 6/1989 | Gulczynski | 341/144 |
| 4,837,573 | 6/1989 | Brooks | 341/144 |

Primary Examiner—William M. Shoop, Jr.
Assistant Examiner—Randy Wayne Gibson
Attorney, Agent, or Firm—Haugen and Nikolai

[57] ABSTRACT

A precision ratioed digital-to-analog data converter. A first latch stores a first digital word having a first numerical value and a second latch stores a second digital word having a second numerical value. A down counter alternately receives data from the first and second latches and is connected to a flip flop device to produce a waveform signal having first and second pulse components of opposite polarity. The first and second pulse components have a duration proportional to the first and second digital words. The output waveform is then inverted through an inverter comprising matched P and N channel MOSFETS. The inverted waveform is then presented to an RC integrator circuit which produces a DC signal. The DC signal is passed through a buffer amplifier connected in a voltage follower configuration.

8 Claims, 1 Drawing Sheet

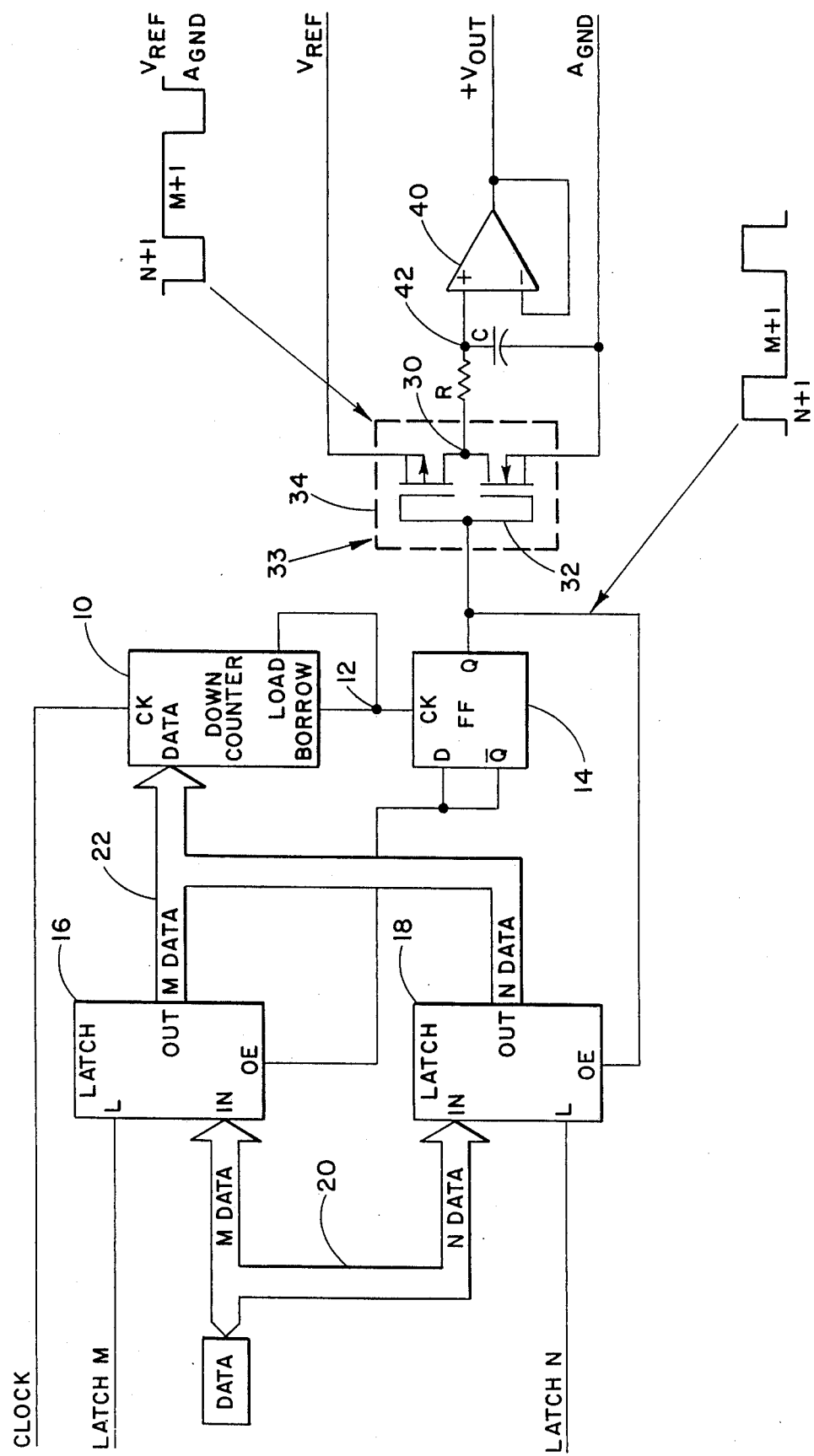

4,958,159

DIGITAL-TO-ANALOG CONVERTER

FIELD OF THE INVENTION

The invention is directed generally to a digital-to-analog converter circuit and, more particularly, to a precision ratioed digital-to-analog converter employing CMOS integrated circuitry.

DISCUSSION OF THE PRIOR ART

Conventional digital-to-analog converters (DACs) require precision ratioed resistors, capacitors or current sources. The present invention has advantages over the conventional devices since such precision ratioed components and devices are not necessary in order to provide precision digital-to-analog conversion voltages using apparatus made in accordance with the present invention.

SUMMARY OF THE INVENTION

The present invention provides a digital-to-analog data converter. The converter includes a first means for storing a first digital word having a first value, a second means for storing a second digital word having a second value, means for alternately down counting the first and second stored words, means for inverting and means for supplying an analog output signal. The first and second digital words represent first and second numerical values. The down counting means down counts the numerical values of the first and second words so as to produce an output waveform having a first pulse component of a first polarity and a second pulse component of an opposite polarity wherein the first and second pulse components have durations proportional to the first and second values respectively. The inverting means is connected to the counting means and inverts the output waveform. The inverted output waveform is then presented to the analog signal supplying means which outputs an analog signal corresponding to the durations of the first and second pulse components.

In the preferred embodiment of the invention, the inverting means comprises a pair of matched MOSFETs arranged in a standard inverter configuration. The output voltage of the MOSFET inverter is then fed to an RC circuit which integrates the inverted output waveform to provide a DC output. The DC output is then presented to a buffer amplifier which, in turn, provides a low impedance output of a precision ratioed signal which follows the integrated DC output.

It is one object of the invention to provide a precision ratioed digital-to-analog converter wherein most of the elements are integratable in standard CMOS integrated circuits.

It is yet another object of the invention to provide a precision ratioed digital-to-analog converter which is more economical because it does not require precision ratioed resistors, capacitors or current sources.

Other objects, features and advantages of the invention will be apparent to those skilled in the art through the figure, specification and claims herein.

BRIEF DESCRIPTION OF THE DRAWINGS

The sole FIGURE is a schematic illustration of a precision ratioed digital-to-analog converter made in accordance with the present invention.

DESCRIPTION OF THE PREFERRED EMBODIMENT

Referring to the sole FIGURE, one example of a precision ratioed digital-to-analog converter as provided by the present invention is shown. The DAC includes a data bus 20, latching circuits 16 and 18, a second data bus 22, down counter circuit 10, flip flop 14, inverter 33, an RC integrating circuit and a buffer amplifier 40. While the preferred embodiment of the invention may be advantageously implemented in CMOS with the exception of the resistor R and capacitor C, those skilled in the art having the benefit of the disclosures of the present invention will appreciate that other semiconductor technologies may be used to implement the invention. For example, the invention may be integrated using TTL technology, gate arrays or other available integrated circuit techniques.

The first data bus 20 carries data words M and N. Latch 16 accepts the M data word when enabled at pin L by an appropriate digital command signal. Similarly, latch 18 accepts the N data word when enabled at its pin L. Latches 16 and 18 may be register devices capable of handling digital words of any convenient length, such as four bits, eight bits, sixteen bits, thirty two bits, sixty four bits, etc. The digital words M and N represent numerical values supplied by an external source represented as DATA. Output bus 22 carries the stored M and N data words from latches 16 and 18 when the latches are enabled by an appropriate digital signal appearing at the output enable (OE) pins of each latch. Output bus 22 presents the data to down counter 10. Down counter 10 is, in turn, connected to flip flop 14 at the CK input of the flip flop and the BORROW output of the down counter. The LOAD command pin of the down counter is also connected to the BORROW output.

A first output of the flip flop 14, Q is connected to the output enable of latch 18. A second output of the flip flop 14, Q is connected to the D input of the flip flop and the OE input of latch 16. The Q output of the flip flop is also connected to the input of inverter 33. Inverter 33 is advantageously comprised of a pair of MOSFETs which are matched for ON resistance values. The MOSFETs are connected in a standard inverter configuration. The first MOSFET 34 is advantageously a P channel MOSFET and the second MOSFET 32 is advantageously an N-channel MOSFET. Such matching is advantageously done with CMOS logic which has low ON resistance. The P channel MOSFET and N channel MOSFET can be matched fairly easily by scaling the P channel device to be sized at about 2.5 times bigger than the N channel device thereby making the ON resistance approximately equal. In the example illustrated, a first terminal of MOSFET 34 is connected to a reference voltage $V_{REF}$. The output of MOSFET 34 is tied to the output of MOSFET 32 and a first terminal of resistor R. A first terminal of MOSFET 32 is tied to analog ground $A_{GND}$. The second terminal of resistor R is connected to a first terminal of capacitor C. The second terminal of capacitor C is connected to $A_{GND}$. R and C are connected at node 42 which is further connected to the non-inverting input of buffer amplifier 40. Amplifier 40 is advantageously connected in a voltage follower configuration with the inverting input tied to the output, $+V_{OUT}$.

Having described the elements in one example of a digital-to-analog converter made in accordance with the present invention, the operation of the invention will now be described. It is to be understood that the detailed examples used herein are solely intended to illustrate the principles of the invention and the invention is not to be considered as limited by the examples.

Starting with DATA introduced into the digital-to-analog converter shown in the FIGURE, M and N data words are introduced via the DATA source onto bus 20. Typically, the M and N data will be alternately transmitted and will share the same bus. Note that it may be advantageous for some applications to partition the bus so as to allow the M and N data words to be introduced into storage devices simultaneously. Assuming that the M data word is present on bus 22, latch 16 operates to receive and latch in the M data word when an appropriate digital signal appearing on the LATCH M line at input pin L. After the M data word has been latched into latch 16, the N data word is similarly latched into latch 18 at input pin IN through the operation of an appropriate digital signal appearing at input L as provided by the LATCH N command line. This operation continues in a continuous manner as new data continues to be input onto the bus 20.

Data is alternately read out of the latches 16 and 18 by the down counter 10. Down counter 10 counts down at the rate determined by the CLOCK at input CK. The down counter 10 operates in a conventional manner. When the counter counts down to 0, the next count will cause a pulse to issue out of the BORROW output which is connected to the clock input CK of flip flop 14 and the LOAD command input of the down counter. The flip flop 14 triggers on the leading edge of the BORROW output pulse and the LOAD command triggers on the falling edge of the BORROW output pulse. The flip flop 14 is configured to toggle information back and forth into the down counter by operating the output enables of the latches 16 and 18 using the output pulses of its opposite outputs Q and $\bar{Q}$. Assuming that positive logic is used, for example, when Q goes high, the $\bar{Q}$ output will go low and latch 18 will be enabled to present N word data to bus 22. The N word data is received by down counter which operates to count down the N word data being presented to it. In this way, the output of flip flop 14 at pin Q will alternately output a waveform comprising a first pulse having a duration of N+1 clock cycles and a second component pulse having a duration of M+1 clock cycles as is shown in the graph under inverter 33. The single added clock cycle in each component pulse is caused by the extra clock cycle needed by the down counter to output the BORROW pulse. The waveform provided by flip flop 14 is then introduced into inverter 33 at the connected gates of MOSFETs 32 and 34. As shown by the graph above inverter 33, the waveform is inverted at the output 30 so that the pulse of duration N+1 has a polarity opposite the polarity it had coming out of flip flop 14. Similarly, the M+1 duration portion of the waveform is also inverted.

The inverted waveform is presented to a first terminal resistor R at node 30. The RC network then operates to integrate the inverted output waveform into a precision direct current voltage at node 42 which is presented to buffer amplifier 40. Buffer amplifier 40 is a low impedance output source which provides an analog signal which precisely follows the integrated DC voltage appearing at node 42. The voltage $V_{REF}$ is a preselected reference voltage supplied by an external power source. In this way, the digital-to-analog converter continues to accept M data words and N data words of any numerical value, convert the data into waveforms having pulse components proportional to those values, and further convert those pulse components into analog signals proportional to the numerical values of the M and N data words.

Those skilled in the art having the benefit of the disclosures herein will appreciate that the clock rate introduced into the down counter may be any typical rate as used in available CMOS devices. The rate at which the clock is run will be a significant factor in determining the useful maximum length of the data words. While most of the components can be integrated into a CMOS integrated circuit, the R and C components may advantageously be discrete elements in order to achieve the precision required for typical applications of the circuit of the invention. While it is not necessary to use precision R and C capacitors using the teachings of the present invention, it is advantageous to select the R and C values to have a time constant which minimizes ripple voltage at the integrated output but, at the same time, does not produce long delays for the buffered output voltage to achieve its steady state value. A typical range for resistance R is about 50,000-25,000 ohms, whereas the ON resistance of the inverter MOSFETS may be on the order of about 5 ohms. The present invention works particularly well for low speed applications wherein the output signal varies on the order of about 10 hertz.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A digital-to-analog data convertor comprising:
   (a) a first means for storing a first digital word having a first value;
   (b) a second means for storing a second digital word having a second value;
   (c) means for alternately down counting the first and second stored words responsive to the first and second storage means so as to produce an output waveform having a first pulse component of a first polarity and a second pulse component of an opposite polarity wherein the first and second pulse components have durations proportional to the first and second digital word values;
   (d) means for inverting the output waveform connected to the down counting means; and
   (e) means for supplying an analog output signal proportional to the durations of the first and second pulse components, wherein the supplying means is responsive to the inverted waveform.

2. The apparatus of claim 1 wherein the first and second storing means are latching circuits.

3. The apparatus of claim 1 wherein the first and second storing means are register devices.

4. The apparatus of claim 1 wherein the down counter means includes a down counter having a BORROW output connected to a flip flop having a clock input, wherein the first and second storage means include output enable inputs, and wherein the flip flop also has first and second complimentary outputs connected to the output enable inputs of the first and second storing means respectively.

5. The apparatus of claim 4 wherein the inverting means comprises a P channel MOSFET and an N channel MOSFET connected in a standard inverter configuration.

6. The apparatus of claim 5 wherein the analog output supplying means comprises an RC integrator circuit having an output, and a buffer amplifier connected at a first input to the output of the RC integrator network, and wherein the buffer amplifier is configured as a voltage follower circuit.

7. The apparatus of claim 6 wherein the P and N channel MOSFETS have matched ON resistance values.

8. A digital-to-analog converter comprising:
(a) a first latch for storing a first digital word having a first value;
(b) a second latch for storing a second digital word having a second value;
(c) a first data bus for presenting the first and second digital words to the first and second latches respectively;
(d) a second data bus for receiving the latched digital words from the first and second latches;
(e) a down counter which receives the first and second digital words from the first and second latches through the second data base wherein the down counter has a BORROW output and a load command input wherein the BORROW output provides a pulse one clock cycle after the digital word is counted down to 0;
(f) a flip flop having a clock input connected to trigger on the leading edge of the pulse appearing at the BORROW output wherein the complementary outputs of the flip flop are connected so as to alternately enable the first and second latches to present data to the down counter;
(g) an inverter circuit comprising first and second matched MOSFETS having gates connected to the first output of the flip flop;
(h) an RC integrator circuit connected to the output of the inverter; and
(i) a buffer amplifier configured as a voltage follower circuit which receives the output of the RC integrator circuit and provides an analog signal which follows the RC integrator output.

* * * * *